(12) United States Patent
Simon et al.

(10) Patent No.: US 10,693,569 B1
(45) Date of Patent: Jun. 23, 2020

(54) METHOD OF PROVIDING A PHASE REFERENCE, METHOD FOR ESTABLISHING KNOWN PHASE RELATIONSHIPS AS WELL AS PHASE REFERENCE SYSTEM

(71) Applicant: Rohde & Schwarz GmbH & Co. KG, Munich (DE)

(72) Inventors: Hans-Joachim Simon, Munich (DE); Jakob Hammer, Munich (DE); Manfred Mueller, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/297,406

(22) Filed: Mar. 8, 2019

(51) Int. Cl.
   *H04B 17/00* (2015.01)
   *H04B 17/20* (2015.01)
   *G01R 31/28* (2006.01)

(52) U.S. Cl.
   CPC .......... *H04B 17/20* (2015.01); *G01R 31/2822* (2013.01)

(58) Field of Classification Search
   CPC ...... H04B 17/20; G01R 35/00; G01R 35/005; G01R 27/26; G01R 27/28; G01R 31/2822; G01R 23/20; H04L 27/107
   See application file for complete search history.

(56) References Cited

U.S. PATENT DOCUMENTS

| 7,739,063 | B2 | 6/2010 | Betts et al. | |
|---|---|---|---|---|
| 8,378,751 | B2* | 2/2013 | Fagg | H03L 7/23 331/10 |
| 2004/0174928 | A1* | 9/2004 | Siwiak | H04B 1/71635 375/146 |
| 2004/0192240 | A1* | 9/2004 | Futamura | H04B 7/12 455/183.1 |
| 2011/0122936 | A1* | 5/2011 | Dehlink | G01R 31/2822 375/224 |

FOREIGN PATENT DOCUMENTS

| CN | 102087346 A | 6/2011 |
|---|---|---|
| CN | 102901876 A | 1/2013 |
| CN | 107884621 A | 4/2018 |

* cited by examiner

*Primary Examiner* — Thanh C Le
(74) *Attorney, Agent, or Firm* — Christensen O'Connor Johnson Kindness PLLC

(57) ABSTRACT

A phase reference system for a phase-sensitive receiver is shown that provides an output signal which can be used for phase calibration of a frequency-converting device under test. The phase reference system has a first frequency generator that generates a first generator signal with a first generator frequency fg1 and a second frequency generator that generates a second generator signal with a second generator frequency fg2. The first and second generator signals are fed to a multiplier. The multiplier process the signals and outputs first, second and third spectral line data.

19 Claims, 4 Drawing Sheets

METHOD OF PROVIDING A PHASE REFERENCE, METHOD FOR ESTABLISHING KNOWN PHASE RELATIONSHIPS AS WELL AS PHASE REFERENCE SYSTEM

FIELD OF THE DISCLOSURE

Embodiments of the present disclosure relate generally to a method of providing a phase reference for a phase-sensitive receiver. Further, embodiments of the present disclosure relate to a method for establishing known phase relationships. In addition, embodiments of the present disclosure generally relate to a phase reference system.

BACKGROUND

Modern electronic devices inter alia comprise receivers that may have frequency-converting units such as a mixer. For setting up the receiver, a phase calibration of the receiver is necessary, in particular for frequency-converting measurements such as mixer measurements.

So far, a harmonic grid of several frequency points is generated that is used for phase calibration of the receiver, in particular the frequency-converting unit, also called frequency-converting device under test in the specific calibration procedure. For doing so, a base frequency is defined that is processed by division and pulse shaping in order to obtain a comb spectrum. The comb spectrum comprises several comb lines wherein all comb lines, namely equally spaced frequency lines, have a certain relationship to the base frequency defined previously.

However, the phase relationship of the receiver can only be calibrated for frequencies that correspond to the comb lines. For other frequencies, interpolations are necessary which result in higher measurement uncertainties.

Accordingly, there is a need for a possibility to calibrate a device under test in a more accurate manner.

SUMMARY

Embodiments of the present disclosure provide a method of providing a phase reference for phase-sensitive receiver. The method in some embodiments includes the following steps:

generating, by using a first frequency generator, a first generator signal with a first generator frequency;

generating, by using a second frequency generator, a second generator signal with a second generator frequency;

providing the first generator signal and the second generator signal into a multiplier; and outputting a first spectral line with a first frequency, a second spectral line with a second frequency and a third spectral line with a third frequency, wherein the first frequency is equal to a first integer multiple of the first generator frequency, the second frequency being equal to a second integer multiple of the second generator frequency and the third frequency being equal to the sum or the difference of the first frequency and the second frequency.

Further, embodiments of the present disclosure provide a phase reference system for a phase-sensitive receiver. The system in some embodiments includes:

a first frequency generator being configured to generate a first generator signal with a first generator frequency;

a second frequency generator being configured to generate a second generator signal with a second generator frequency; and a multiplier connected to both frequency generators to obtain the first generator signal and the second generator signal, wherein both frequency generators are independent from each other, wherein the phase reference system is configured to generate at least three spectral lines with a first frequency, a second frequency and a third frequency, the first and second frequencies being integer multiples of the first and second generator frequency, respectively, wherein the third frequency is equal to the sum or the difference of the first frequency and the second frequency.

Accordingly, the frequencies of the spectral lines provided by the phase reference system or rather the method of providing a phase reference ensure that the respective frequencies may be chosen in a desired manner. Therefore, the calibration of the receiver can be done in any arbitrary manner since the frequency points used for calibrating the phase relationship of the receiver do not necessarily have to correspond to frequency points of a harmonic frequency grid.

Put another way, by choosing the frequencies of the first generator and the second generator in an appropriate way, a typical measurement setup for a frequency-converting device under test, like a mixer, can be phase-calibrated at exactly the frequencies that are of interest. These need not necessarily coincide with the harmonic frequency grid.

Furthermore, with embodiments of the present disclosure, the power of the those spectral lines that are required for phase calibration can be selectively increased, whereas in prior art disclosures, the available signal power is equally spread over frequency ranges that are only partly of interest for calibration, as other parts are not of interest for calibration. Put another way, the signal power can be directed to specific spectral lines being of interest. This yields a significant improvement with regard to the signal-to-noise ratio (SNR), which is also called S/N.

In general, the method as well as the phase reference system significantly reduce the measurement uncertainty so that an improved phase calibration of a phase-sensitive receiver is ensured.

According to an aspect, the first integer multiple equals n, wherein the second integer multiple equals m, and wherein n and m are different integer numbers. Accordingly, the first generator frequency as well as the first frequency have a relationship among each other; namely $n*f_{g1}=f_1$, wherein n corresponds to the first integer multiple, $f_{g1}$ corresponds to the first generator frequency and $f_1$ corresponds to the first frequency. Moreover, the second generator frequency as well as the second frequency have a relationship among each other; namely $m*f_{g2}=f_2$, wherein m corresponds to the second integer multiple, $f_{g2}$ corresponds to the second generator frequency and $f_2$ corresponds to the second frequency.

According to another aspect, the multiplier is a modulator and a carrier frequency for the modulator is based on the first generator frequency. In other terms, the first generator frequency in some embodiments is forwarded to the modulator. The modulator processes at least the first generator signal received so that an output signal of the modulator has a carrier signal portion with a carrier frequency that is assigned to the first generator frequency. In some embodiments, the first signal corresponds to the carrier signal portion.

In some embodiments, a modulation frequency for the modulator is based on the second generator frequency. The second generator frequency is assigned to the second generator signal which is also forwarded to the modulator that processes the second generator signal as well. Hence, the output signal of the modulator also has a modulation signal portion that is assigned to the modulation frequency that is assigned to the second generator frequency. In some embodiments, the second signal corresponds to the modulation signal portion.

The multiplier may be a frequency mixer that has three mixer frequencies comprising radio frequency (RF), intermediate frequency (IF) and local oscillator (LO). The first generator frequency and the second generator frequency are two of the three mixer frequencies. Accordingly, the first frequency may be one of radio frequency (RF), intermediate frequency (IF) and local oscillator (LO). Similarly, the second frequency may be one of radio frequency (RF), intermediate frequency (IF) and local oscillator (LO).

According to another aspect, the first frequency is within a linear frequency grid, wherein the second generator frequency is the step size of the linear frequency grid. Accordingly, all frequencies in the grid are covered by spectral lines. The frequency grid is chosen based upon the intended measurement introduced by a customer or rather a user. In some embodiments, the user or rather the customer sets the second generator frequency appropriately.

Generally, the user may be enabled to set the respective frequencies depending on the testing scenario to be applied.

Another aspect provides that a phase relationship between the spectral lines of the first frequency and the second frequency is determined based on a Fourier transform of an output signal of the multiplier. The output signal encompasses the spectral lines with the first frequency, the second frequency and the third frequency. Applying a Fourier transform on the output signal ensures that amplitudes and phases of all spectral lines can be determined. Accordingly, the respective phase relationships between the spectral lines can be derived. In other words, the relative phases can be determined by performing a Fourier transform of the known time-domain waveform of the output signal.

In some embodiments, an output signal with an ideal rectangular waveform is outputted by the multiplier. For instance, at least one of the first generator signal and the second generator signal has a rectangular waveform. In some embodiments, the first generator signal and the second generator signal both each have a rectangular waveform. The respective generator signals are processed by the multiplier in an appropriate manner so that the output signal may correspond to a pure digital signal. Processing in some embodiments can be carried out in one or more circuits, a programmed microprocessor, or the like.

According to another embodiment, an output signal is outputted by the multiplier, wherein the output signal is superimposed by at least one of a rising edge signal of arbitrary but known shape, an ideal rectangular waveform and a falling edge signal of arbitrary but known shape. The superimposing of the respective edge signals or rather the ideal rectangular waveform ensures that a sampled copy of a Fourier transform with a distance equal to the repetition rate of the pulses is obtained. Therefore, phase relationships can be determined in case of a non-ideal output signal in which the edges of the output signal are not ideal.

Another aspect provides that the multiplier comprises at least one of a digital gate, an analog mixer and an analog modulation circuit with known transfer characteristics. Thus, the respective generator signals may be processed digitally or rather in an analog manner.

Further, embodiments of the present disclosure provide a method for establishing known phase relationships between signals at different frequencies, wherein a first swept frequency, a second swept frequency and a third frequency are used, wherein the method has at least a first tier in which the method of providing a phase reference described above is applied, with the following steps:

in the first tier, the first frequency is placed at one of several frequency grid points within a first sweep range assigned to the first swept frequency; and in the first tier, the third frequency is placed at one of several frequency grid points within a second sweep range assigned to the second swept frequency.

Accordingly, the method of providing a phase reference may be used for establishing known phase relationships between signals at different frequencies. Therefore, the output signal can be used for certain measurements.

In some embodiments, the first frequency, for instance the one outputted by the multiplier of the phase reference system, is placed at one of several frequency grid points within the first sweep range. Moreover, the third frequency is placed at one of several frequency grid points within the second sweep range. Thus, the respective frequencies are set by the user or rather the operator appropriately.

However, in the first tier, the third frequency corresponds to the first frequency plus or minus an integer multiple of the second generator frequency. Further, the second frequency is equal to the integer multiple of the second generator frequency.

In other words, the method of providing a phase reference is performed in the first tier of the method for establishing known phase relationships between signals at different frequencies, wherein the respective frequencies, namely the first one and the third one, are chosen to be within the corresponding sweep ranges.

According to an embodiment, the third frequency is kept constant, wherein the method has a second tier as well as a third tier, with the following additional steps:

in the second tier, the first frequency is placed at one of several frequency grid points within the first sweep range assigned to the first swept frequency, and the second generator frequency is chosen as a step size for the frequency grid of the first sweep range; and in the third tier, the first frequency is placed at one of several frequency grid points within the second sweep range assigned to the second swept frequency, and the second generator frequency is chosen as the step size for the frequency grid of the second sweep range.

In some embodiments, the method of providing a phase reference described above may be applied in the second tier. In the second tier, the first frequency, for instance the one outputted by the multiplier of the phase reference system, is maintained compared to the first frequency in the first tier. However, the second generator frequency is set such that it corresponds to the step size for the frequency grid of the first sweep range. As already mentioned, the respective frequencies are set by the user or rather the operator appropriately.

Accordingly, the third frequency is equal to the first frequency plus or minus the second frequency. Further, the third frequency is equal to a first integer multiple of the first generator frequency plus or minus a second integer multiple of the second generator frequency.

Since the second generator frequency is set to the step size for the frequency grid, all frequencies in the respective grid(s) are covered by spectral lines outputted.

The aforementioned steps can be performed in consecutive tiers as described above. Common frequencies contained in pairs of consecutive tiers allow to build up multiple, not necessarily equidistant grids of frequency points that can be adapted to specific, typical measurement tasks where e.g. a phase relationship between the radio frequency (RF) grid and the intermediate frequency (IF) grid of a mixer is required.

While general, non-equidistant frequency grids can be covered by repeating a two-tier procedure for each pair of frequencies, equidistant grids can be calibrated in a time-efficient way by performing once a three-tier procedure.

Moreover, the method ensures that one fixed frequency as well as two swept frequencies are used for performing the respective measurement on the frequency-converting device under test, for instance a mixer.

According to an aspect, the step size for the frequency grid of the first sweep range is equal to the step size for the frequency grid of the second sweep range. This means that the step sizes for both frequency grids are the same.

Another aspect provides that a phase relationship between one of the frequency grid points of the first sweep range and one of the frequency grid points of the second sweep range is determined. Thus, the phase relationships between the different frequencies applied can be determined appropriately due to the different settings in the tiers.

According to another aspect, the first swept frequency, the second swept frequency and the third constant frequency correspond to an intermediate frequency, a radio frequency and a local oscillator frequency range of a frequency converting device under test in any of the possible permutations. This means that the first swept frequency may be one of the intermediate frequency, the radio frequency and the local oscillator frequency, wherein the second swept frequency is one of the remaining frequencies and the third constant frequency is the last one that remains. In other words, the first swept frequency may be the intermediate frequency, the radio frequency or the local oscillator frequency. Thus, the second swept frequency may also be the intermediate frequency, the radio frequency or the local oscillator frequency. Similarly, the third constant frequency may be the intermediate frequency, the radio frequency or the local oscillator frequency. Hence, each combination can be used so that the radio frequency and the intermediate frequency are swept whereas the local oscillator frequency is the fixed one that can be eliminated. Alternatively, the radio frequency and the local oscillator frequency are swept whereas the intermediate frequency is the fixed one. Similarly, the intermediate frequency and the local oscillator frequency are swept whereas the radio frequency is fixed. The latter embodiments correspond to up- or rather down-converting.

In general, the method may correspond to a phase calibration procedure for a frequency-converting device under test. The frequency-converting device under test may be a mixer.

According to another embodiment, the third frequency is a swept one, wherein the method further only has an additional second tier so that phase relationships are determined in two tiers. The method in some embodiments has the following additional steps:

in the second tier, the first frequency or the third frequency is placed at either the first or third frequency of the first tier; and in the second tier, the other one of the first frequency and the third frequency is placed at one of several frequency grid points within the third sweep range.

Accordingly, only two tiers are used for determining the respective phase relationships. In fact, all frequencies used are swept ones.

In the second tier of this embodiment, the method of providing a phase reference described above may also be applied. Again, the respective frequencies are set by the user or rather the operator appropriately.

Generally, the method may correspond to generating a known phase comb with arbitrary and varying grid spacing for the frequency-converting device under test. In other words, it is possible to select an arbitrary frequency with known phase relationship that can be used for phase calibration of the frequency-converting device under test while improving the measurement uncertainties.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
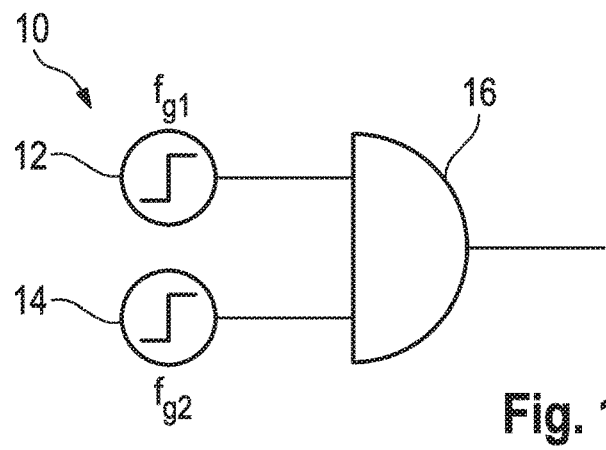
FIG. 1 schematically shows a representative example of a phase reference system according to an embodiment of the present disclosure.

In FIG. 1, a phase reference system 10 for a phase-sensitive receiver is shown that provides an output signal which can be used for phase calibration of a frequency-converting device under test. As shown in the embodiment of FIG. 1, the phase reference system 10 has a first frequency generator 12 that is configured to generate a first generator signal with a first generator frequency fg1 and a second frequency generator 14 that is configured to generate a second generator signal with a second generator frequency fg2. The frequency generators 12, 14 are independent from each other. In addition, a multiplier 16 is provided that is connected with both frequency generators 12, 14 in order to obtain the first generator signal and the second generator signal. The multiplier 16 may be established by a digital circuit, for instance a gate, or by an analog circuit, for instance a mixer or modulator.

Figure 2:
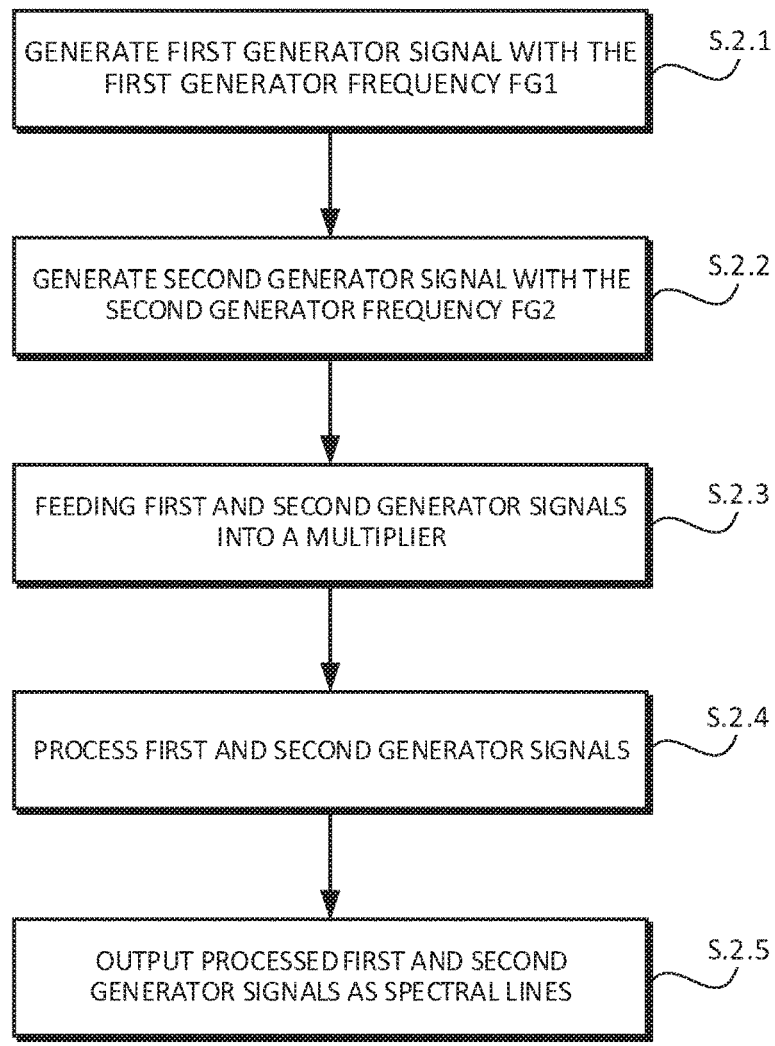
FIG. 2 shows a flow-chart illustrating a representative embodiment of a method of providing a phase reference for a phase-sensitive receiver according to the present disclosure.

With respect to FIG. 2, a method of providing a phase reference for a phase-sensitive receiver is described that can be performed by the phase reference system 10 shown in FIG. 1.

In a first step S.2.1, the first generator signal with the first generator frequency fg1 is generated by the first frequency generator 12. In a second step S.2.2, the second generator signal with the second generator frequency fg2 is generated by the second frequency generator 14. Both generator signals are fed into the multiplier 16 in a third step S.2.3.

In a fourth step S.2.4, the multiplier 16 processes the respective generator signals received so that the phase reference system 10, for example the multiplier 16, is configured to generate at least three spectral lines with a first frequency f1, a second frequency f2 and a third frequency f3. These spectral lines are outputted in a fifth step S.2.5. In other words, the phase reference system 10, for example the multiplier 16, outputs a signal, namely an output signal, encompassing the spectral lines with the first frequency f1, the second frequency f2 and the third frequency f3.

The spectral lines or rather the respective frequencies f1, f2, f3 can be set by a user or rather an operator of the phase reference system 10 depending on the desired spectral lines used for measurement purposes.

The first generator frequency fg1 and the first frequency f1 relate to each other since the n-th harmonic of the first generator frequency fg1 is equal to the first frequency f1 as described by the following equation:

$$n \cdot f_{g1} = f_1$$

Similarly, the second generator frequency fg2 and the second frequency f2 relate to each other since the m-th harmonic of the second generator frequency fg2 is equal to the second frequency f2 as described by the following equation:

$$m \cdot f_{g2} = f_2$$

Further, the third frequency f3 is further equal to a multiple of the first generator frequency fg1 plus or minus a multiple of the second generator frequency fg2. This means that the following equation is fulfilled:

$$f_3 = f_1 \pm f_2 = n \cdot f_{g1} \pm m \cdot f_{g2}$$

Generally, the respective generator signals are forwarded to the multiplier 16 that processes the generator signals appropriately as described above. Accordingly, the first frequency f1 that is generated by the multiplier 16 may be equal to a carrier frequency $f_{mRF}$. Moreover, the third frequency f3 that is also generated by the multiplier 16 may be equal to an intermediate frequency $f_{mIF}$; $f_{mRF}$ may be the input frequency of a mixer under test (MUT) and $f_{mIF}$ may be the output frequency, or vice versa.

Moreover, the first frequency f1 may be set to be within a linear frequency grid, for example in the middle of the frequency grid. In addition, the second generator frequency fg2 may be set to correspond to the step size DF of the linear frequency grid. Thus, all frequencies in the grid are covered by spectral lines of the output signal of the multiplier 16.

Generally, a phase relationship between the spectral lines of the first frequency f1, the second frequency f2 and the third frequency f3 can be determined based on a Fourier transform of the output signal of the multiplier 16. In some embodiments, this transformation can be carried out by circuitry, a programmed microprocessor, or the like.

In an ideal case, the first generator signal as well as the second generator signal may have rectangular waveforms. The multiplier 16 multiplies these signals by each other so that its output signal has a rectangular shape, too. The waveforms are not distorted or rather disturbed during the multiplication process.

Figure 4:
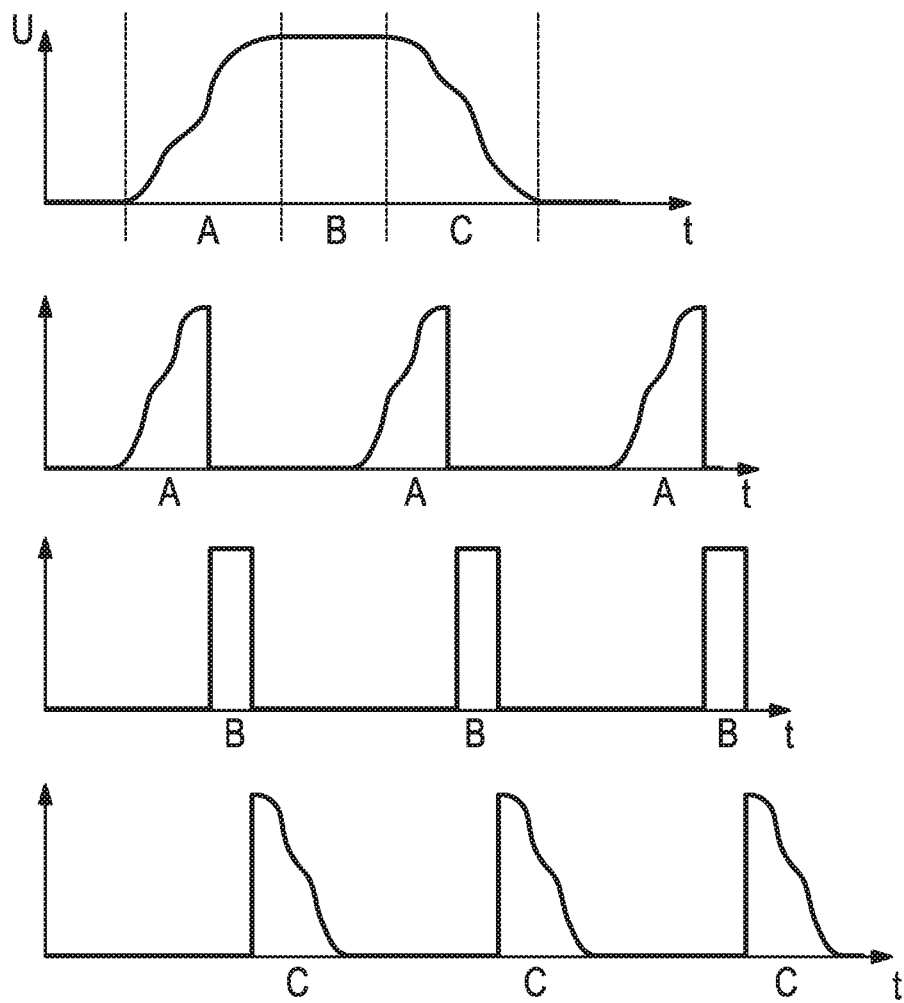
FIG. 4 shows an overview of signals used for superimpositions.

Should the output signal provided by the multiplier 16 be non-ideal, the output signal is superimposed by at least one of a rising edge signal of arbitrary but known shape, an ideal rectangular waveform and a falling edge signal of arbitrary but known shape. This is generally shown in FIG. 4.

Hence, non-ideal signals, in particular signal edges, are processed as being superimpositions of the respective waveforms.

Figure 5:
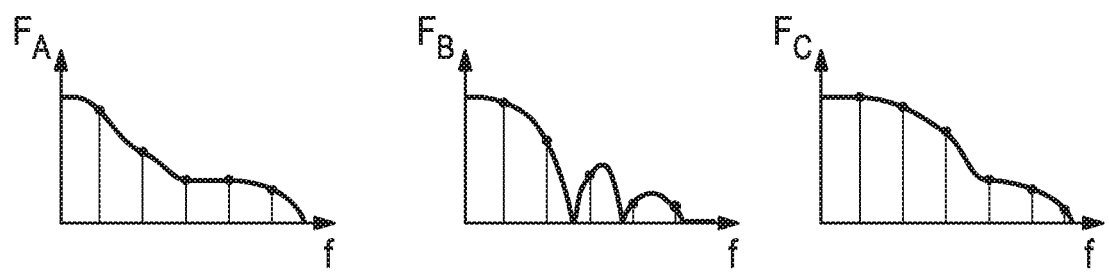
FIG. 5 shows the Fourier spectra of the signals shown in FIG. 4.

The spectra of signals used for superimposition may be derived from the Fourier spectra of the signals which are shown in FIG. 5. Assuming periodic signals, their Fourier spectra can be determined by multiplying the continuous spectrum of the respective single-shot time domain waveform by a Dirac comb spectrum where the frequency distance between the Dirac lines equals the repetition frequency (inverse period) of the periodic signal. The respective Fourier spectra superimpose with each other additively.

By using fast sampling oscilloscopes, the single-shot waveform of the signals can be precisely measured in the time domain, and a discrete Fourier transform can be performed numerically. In the case of ideal rectangular periodic signals, the spectrum needs not even be determined numerically, but can be calculated analytically as a sinc function, the parameters of which depend on pulse width and repetition frequency in a well-known manner described by the theory of signals in linear systems. This allows the spectrum and its respective uncertainties to be traced back to time domain measurements.

Considering real-world signals like those shown in FIG. 4, the rising and falling edges are independent from each other and they do not intersect with each other.

Figure 3:
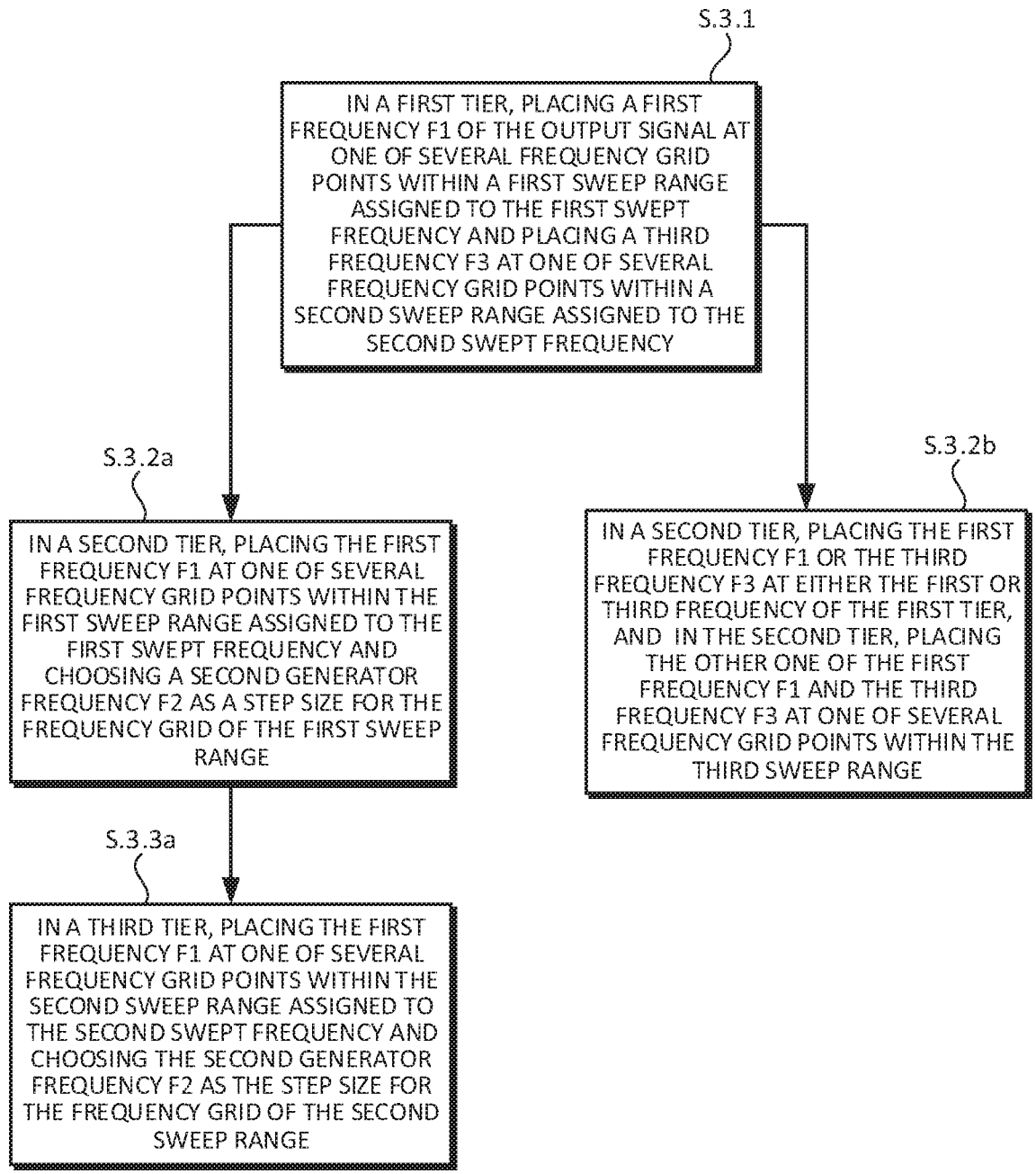
FIG. 3 shows a flow-chart illustrating a representative embodiment of a method of providing a signal for a frequency-converting device under test according to the present disclosure.

Generally, the phase reference system 10 as well as the method of providing a phase reference can be used for providing a signal for a frequency-converting device under test like a MUT as illustrated in FIG. 3 showing two different embodiments as will be described hereinafter.

In some embodiments, a phase calibration procedure on the frequency-converting device under test or rather generating a known phase comb with arbitrary and varying grid spacing for the frequency-converting device under test may be done while using the phase reference system 10 as well as the method of providing a phase reference described above.

More specifically, the frequencies that are fed to or are generated by the frequency-converting device under test may comprise a first swept frequency (e.g. the radio frequency RF of a MUT), a second swept frequency (e.g. the intermediate frequency IF of a MUT), and a third frequency (e.g. the local oscillator frequency LO of a MUT).

In the method according to the first embodiment, one of these frequencies is kept constant, for instance the third one, whereas the two remaining frequencies are swept in equidistant frequency grids. These frequency grids are related to each other in the way that the second grid can be generated by shifting and optionally mirroring the first grid on the frequency axis.

The first embodiment comprises three tiers in order to establish a known phase relationship between any two frequencies of the swept ranges.

If required, a phase relationship can also be established between any of the swept frequencies and the third, constant frequency.

In contrast thereto, the method according to the second embodiment comprises a first swept frequency, a second swept frequency and a third swept frequency wherein only two tiers are used for providing a phase relationship for a frequency-converting device under test.

For each triple of frequency points, where the first frequency point belongs to the first sweep range, the second point to the second sweep range and the third point to the third swept frequency range, a phase relationship is established in the first tier between a pair of frequency points. Then, in the second tier, a phase relationship is established between one of these points and the third one.

Basically, the first tier is the same for both embodiments since the first frequency f1 of the output signal is placed at one of several frequency grid points within a first sweep range assigned to the first swept frequency, whereas the third frequency f3 is placed at one of several frequency grid points within a second sweep range assigned to that second swept frequency. The respective step S.3.1 is shown in FIG. 3.

Figure 6:
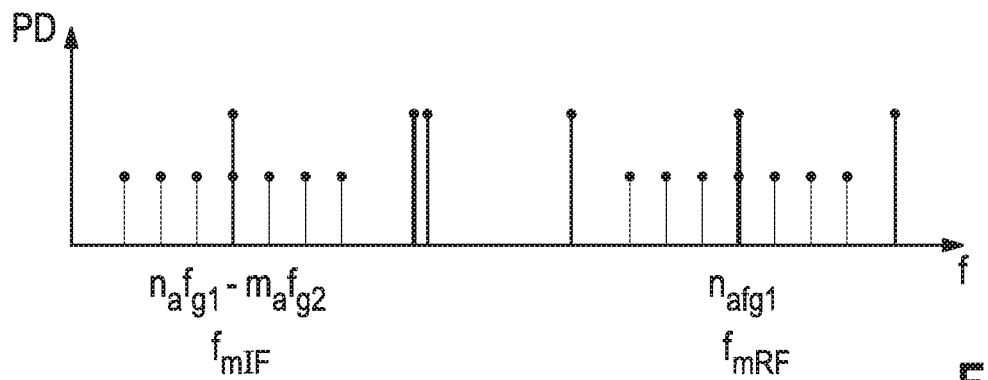
FIG. 6 shows a diagram illustrating the output signal in a first tier of a representative embodiment of a method of providing a signal for a frequency-converting device under test according to the present disclosure.

In FIG. 6, the output signal is shown. It becomes apparent that the spectral line with the first frequency f1—in this special case—corresponds to a frequency point of the radio frequency (RF) grid whereas the third frequency f3 corresponds to a frequency point of the intermediate frequency (IF) grid.

This ensures that a phase relationship can be determined between the spectral lines of the first frequency f1 and the third frequency f3. In some embodiments, a Fourier transform on the output signal of the multiplier 16 is done in order to determine the phase relationship.

Figure 7:
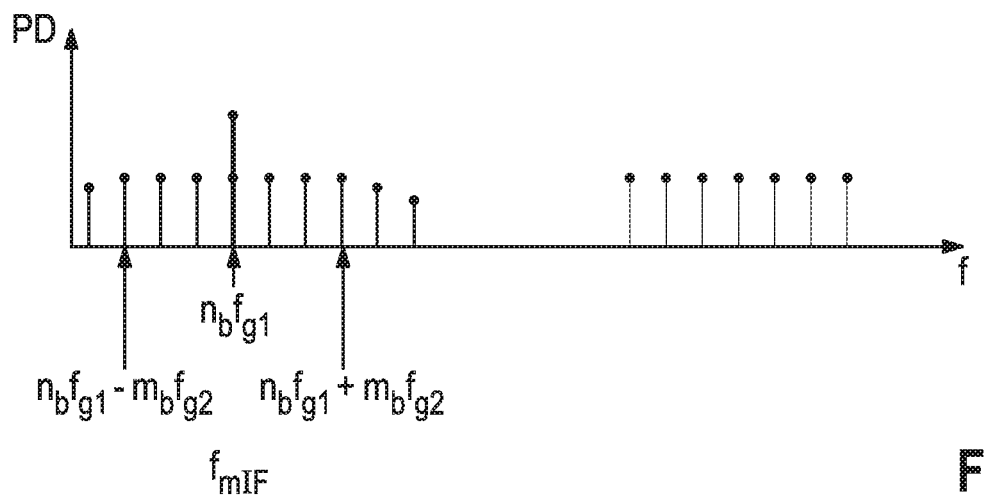
FIG. 7 shows the diagram of FIG. 6 in a second tier.

In the second tier according to the first embodiment (step S.3.2a), the first frequency is the same as in the first tier wherein the second generator frequency fg2 is chosen as the step size DF for the frequency grid of the first sweep range. This is shown in FIG. 7.

This ensures that a phase relationship can be determined between the spectral lines of the first frequency f1 and the frequency points of the associated grid. In some embodiments, a Fourier transform is done in order to determine the phase relationship.

Figure 8:
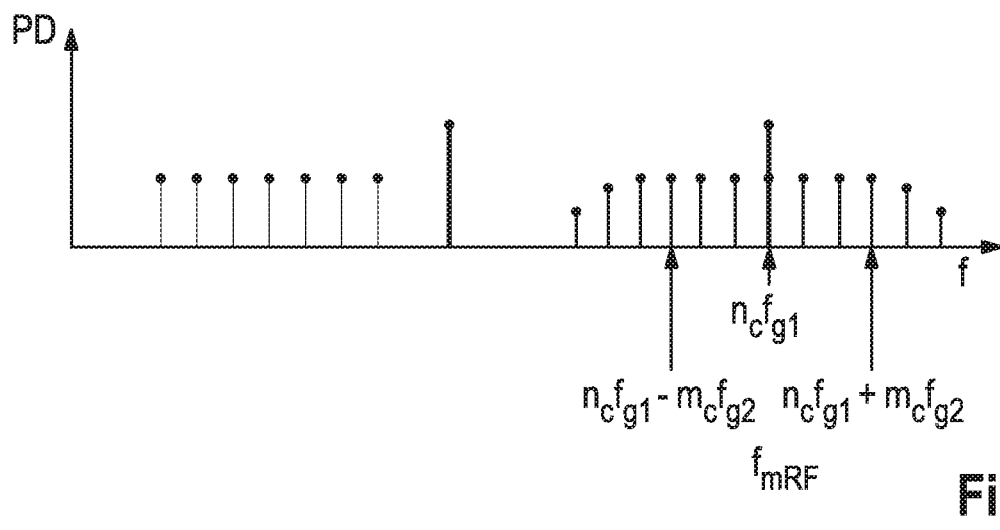
FIG. 8 shows the diagram of FIG. 6 in a third tier.

In the third tier according to the first embodiment (step S.3.3a), the first frequency equals the third frequency in the first tier wherein the second generator frequency fg2 is again chosen as the step size DF for the frequency grid of the second sweep range. This is shown in FIG. 8.

In many practical measurement applications, the step sizes DF of the second and the third tier of the first embodiment will be identical, as well as the number of frequency grid points of the first and second sweep range.

Combining all three tiers of the method of the first embodiment allows one to establish a phase relation between two frequencies in the aforementioned frequency grids that may correspond to the RF and IF sweep ranges of a mixer under test.

In some embodiments, a phase relationship between the first points of both the first and second sweep range can be determined. In the same way, a phase relationship between the second points of the first and second sweep range can be determined, and so on up to the last frequency point of the two sweep ranges.

Referring to the second embodiment shown in FIG. 3 that uses only two tiers, as already discussed, the first tier is the same for both embodiments. However, the second tier (step S.3.2b) is different since the first frequency f1 or the third frequency f3 is placed at either the first or third frequency of the first tier. Further, the other one of the first frequency f1 and the third frequency f3 is placed at one of several frequency grid points within the third sweep range.

This embodiment can be applied in the more general case, where all three frequencies of a frequency converting device under test are arbitrarily swept in non-equidistant frequency grids and a phase relationship must be established between each triple of associated grid points.

Given a first frequency in the point grid of the first swept frequency range, a second frequency in the second swept range and a third frequency in the third swept range, in the first tier a phase relationship is established between the first and the second frequency as previously described for the first embodiment.

Then, in the same way, a phase relationship is established between the first or second frequency and the third one.

Generally, in the first tier, the first frequency, the second frequency and the third frequency correspond to a radio frequency (RF), an intermediate frequency (IF), and a local oscillator frequency (LO) of a frequency converting device under test in any of the possible permutations.

At first glance, it may appear that the second embodiment, which encompasses only two tiers, requires minor effort compared to the first embodiment, which comprises three tiers.

The effort, however, of the second embodiment is generally higher since the two tiers must be performed for each triple of sweep points. In contrast to this, at least in the case of an equidistant frequency grid, the first embodiment requires the first tier to be performed only once. Thereafter, the second and third tier require one frequency setting each, combined with n measurements for the n sweep points.

Generally, the first integer multiple of the first generator frequency, namely n, and the second integer multiple of the second generator frequency, namely m, are different integer numbers.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of providing a phase reference for a phase-sensitive receiver, with the following steps:
   generating, by using a first frequency generator, a first generator signal with a first generator frequency;
   generating, by using a second frequency generator, a second generator signal with a second generator frequency;
   feeding the first generator signal and the second generator signal into a multiplier; and
   outputting a first spectral line with a first frequency, a second spectral line with a second frequency and a third spectral line with a third frequency,
   the first frequency being equal to a first integer multiple of the first generator frequency, the second frequency being equal to a second integer multiple of the second generator frequency and the third frequency being equal to the sum or the difference of the first frequency and the second frequency.

2. The method according to claim 1, wherein the first integer multiple equals n, wherein the second integer multiple equals m, and wherein n and m are different integer numbers.

3. The method according to claim 1, wherein the multiplier is a modulator and a carrier frequency for the modulator is based on the first generator frequency.

4. The method according to claim 3, wherein a modulation frequency for the modulator is based on the second generator frequency.

5. The method according to claim 1, wherein the multiplier is a frequency mixer having three mixer frequencies comprising radio frequency (RF), intermediate frequency (IF) and local oscillator (LO), wherein the first generator frequency and the second generator frequency are two of the three mixer frequencies.

6. The method according to claim 1, wherein the first frequency is within a linear frequency grid, the second generator frequency being the step size of the linear frequency grid.

7. The method according to claim 1, wherein a phase relationship between the spectral lines of the first frequency, the second frequency and the third frequency is determined based on a Fourier transform of an output signal of the multiplier.

8. The method according to claim 1, wherein an output signal with an ideal rectangular waveform is outputted by the multiplier.

9. The method according to claim 1, wherein an output signal is outputted by the multiplier, the output signal being superimposed by at least one of a rising edge signal of arbitrary but known shape, an ideal rectangular waveform and a falling edge signal of arbitrary but known shape.

10. A method for establishing known phase relationships between signals at different frequencies, wherein a first swept frequency, a second swept frequency and a third frequency are used, wherein the method has at least a first tier in which the method according to claim 1 is applied, with the following steps:
    in the first tier, the first frequency is placed at one of several frequency grid points within a first sweep range assigned to the first swept frequency; and
    in the first tier, the third frequency is placed at one of several frequency grid points within a second sweep range assigned to the second swept frequency.

11. The method according to claim 10, wherein the third frequency is kept constant, and wherein the method further has a second tier as well as a third tier, with the following additional steps:
    in the second tier, the first frequency is placed at one of several frequency grid points within the first sweep range assigned to the first swept frequency, and the second generator frequency is chosen as a step size for the frequency grid of the first sweep range; and
    in the third tier, the first frequency is placed at one of several frequency grid points within the second sweep range assigned to the second swept frequency, and the second generator frequency is chosen as the step size for the frequency grid of the second sweep range.

12. The method according to claim 11, wherein the step size for the frequency grid of the first sweep range is equal to the step size for the frequency grid of the second sweep range.

13. The method according to claim 11, wherein a phase relationship between one of the frequency grid points of the first sweep range and one of the frequency grid points of the second sweep range is determined.

14. The method according to claim 11, wherein the first swept frequency, the second swept frequency and the third constant frequency correspond to an intermediate frequency, a radio frequency and a local oscillator frequency range of a frequency converting device under test in any of the possible permutations.

15. The method according to claim 11, wherein the method corresponds to a phase calibration procedure for a frequency-converting device under test.

16. The method according to claim 10, wherein the third frequency is a swept one, and wherein the method further only has an additional second tier so that phase relationships are determined in two tiers, with the following additional steps:
    in the second tier, the first frequency or the third frequency is placed at either the first or third frequency of the first tier; and
    in the second tier, the other one of the first frequency and the third frequency is placed at one of several frequency grid points within the third sweep range.

17. The method according to claim 16, wherein the method corresponds to generating a known phase comb with arbitrary and varying grid spacing for the frequency-converting device under test.

18. A phase reference system for a phase-sensitive receiver, comprising:
    a first frequency generator, the first frequency generator being configured to generate a first generator signal with a first generator frequency;
    a second frequency generator, the second frequency generator being configured to generate a second generator signal with a second generator frequency; and
    a multiplier connected to both frequency generators to obtain the first generator signal and the second generator signal,
    both frequency generators being independent from each other, the phase reference system being configured to generate at least three spectral lines with a first frequency, a second frequency and a third frequency, the first and second frequencies being integer multiples of the first and second generator frequency, respectively, the third frequency being equal to the sum or the difference of the first frequency and the second frequency.

19. The phase reference system according to claim 18, wherein the multiplier comprises at least one of a digital gate, an analog mixer and an analog modulation circuit with known transfer characteristics.

* * * * *